United States Patent
Yamada

(10) Patent No.: US 7,154,748 B2
(45) Date of Patent: Dec. 26, 2006

(54) COOLING STRUCTURE OF ELECTRONIC EQUIPMENT AND INFORMATION PROCESSING EQUIPMENT USING THE COOLING STRUCTURE

(75) Inventor: Satoru Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 119 days.

(21) Appl. No.: 10/767,495

(22) Filed: Jan. 28, 2004

(65) Prior Publication Data

US 2004/0184233 A1  Sep. 23, 2004

(30) Foreign Application Priority Data

Feb. 20, 2003 (JP) .............................. 2003-043105

(51) Int. Cl.
  *H05K 7/20* (2006.01)
  *G06F 1/20* (2006.01)
(52) U.S. Cl. ..................... 361/690; 361/695; 454/184
(58) Field of Classification Search ................ 361/690, 361/695; 454/184; 165/104.34
  See application file for complete search history.

(56) References Cited

U.S. PATENT DOCUMENTS

| | | | | |
|---|---|---|---|---|
| 5,471,099 A | * | 11/1995 | Larabell et al. ................ | 307/53 |
| 5,638,259 A | * | 6/1997 | McCarthy et al. ........... | 361/800 |
| 5,949,646 A | * | 9/1999 | Lee et al. ..................... | 361/695 |
| 6,091,609 A | * | 7/2000 | Hutson et al. ............... | 361/794 |
| 6,151,210 A | * | 11/2000 | Cercioglu et al. ............ | 361/690 |
| 6,188,189 B1 | * | 2/2001 | Blake ........................... | 318/471 |
| 6,459,579 B1 | * | 10/2002 | Farmer et al. ............... | 361/695 |
| 6,504,717 B1 | * | 1/2003 | Heard .......................... | 361/695 |
| 6,594,148 B1 | * | 7/2003 | Nguyen et al. ............. | 361/695 |
| 6,801,428 B1 | * | 10/2004 | Smith et al. ................. | 361/687 |
| 2001/0037985 A1 | * | 11/2001 | Varghese et al. ............. | 211/26 |

FOREIGN PATENT DOCUMENTS

| | | |
|---|---|---|
| JP | 54-99064 | 7/1979 |
| JP | 59-134868 | 8/1984 |
| JP | 61-222298 | 10/1986 |
| JP | 64-59898 | 3/1989 |

* cited by examiner

*Primary Examiner*—Anatoly Vortman
(74) *Attorney, Agent, or Firm*—Greer, Burns & Crain, Ltd

(57) ABSTRACT

A cooling structure of an electronic equipment includes substrate housing parts, an upstream side duct, a downstream side duct, an exhaust device and an air adjusting part. The substrate housing parts detachably house therein one or plurality of substrate units, and the downstream side duct allows the cooling air, which passed from the upstream side duct though the substrate housing part, to flow. The exhaust device is provided at an exhaust part to forcibly discharge air to the outside, thereby allowing the cooling air to flow to the substrate housing parts. The air adjusting part adjusts the volume for cooling air which flows to the downstream side duct.

22 Claims, 20 Drawing Sheets

F I G. 12
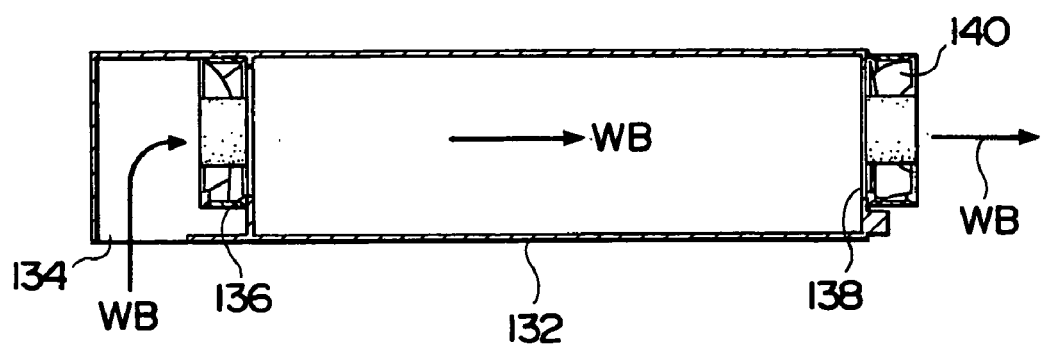

COOLING STRUCTURE OF ELECTRONIC EQUIPMENT AND INFORMATION PROCESSING EQUIPMENT USING THE COOLING STRUCTURE

BACKGROUND OF THE INVENTION

1. Field of the Invention

The invention relates to a cooling structure of an electronic equipment such as substrate units and so forth, which needs forced-air-cooling by fans and so forth, more particularly to a cooling structure of the substrate units, for example, installed in a large server, a disc array unit and so forth, to a cooling structure of other electronic equipment, and to an information processing equipment provided with the cooling structure.

2. Description of the Related Art

With an information processing equipment such as a large server, disk array unit and so forth, a forced-air-cooling structure by use of fans and so forth is employed, for example, as shown in FIGS. 1, 2, 3 and 4. FIG. 1 is an exploded perspective view of the cooling structure, FIG. 2 is an external view as viewed from a front face side of the information processing equipment, FIG. 3 is an external view as viewed from a back face side of the information processing equipment, and FIG. 4 shows a sectional structure of the cooling structure.

There is provided, for example, a rectangular parallelepiped housing 2 in the information processing equipment, wherein a front shelf 4 is provided at the front side of the housing 2 and a back shelf 6 is provided at the back side thereof. A plurality of substrate units 12 are detachably attached to substrate housing parts 8 which are individually installed in the shelves 4, 6, respectively wherein the respective substrate housing parts 8 are partitioned back and forth by a back panel 14. A plurality of fan units 16 are provided at the lower side of the respective substrate housing parts 8, and there is provided an intake duct 18, which is shared by the front shelf 4 and the back shelf 6, at the upstream side of these fan units 16. An intake part 20 is installed at the front shell 4 side in the intake duct 18. A plurality of fan units 22 are provided at the upper side of each substrate housing part 8, and an exhaust duct 24 which is shard by the front shelf 4 and back shelf 6 is formed at the downstream side of the fan units 22, wherein an exhaust port 26 is installed at the back shelf 6 side in the exhaust duct 24.

With the information processing equipment, if the fans 28 of the fan units 16, 22 are rotated, for example, as shown in FIG. 4, air for cooling W is sucked from the intake port 20 into the intake duct 18, and passes through the respective substrate housing parts 8, and it is guided into the exhaust duct 24, then exhausted from the exhaust port 26. Accordingly, the substrate units 12 housed in the respective substrate housing parts 8 are cooled by the passing air for cooling W.

For such a forced-air-cooling structure, there is, for example, JP-A 2002-32148 as a prior art.

JP-A 2002-32148 discloses a cooling structure, as shown in FIG. 2 and the explanation thereof, wherein air is guided from a lower side of a front panel side into a housing by the rotation of cooling fans provided at the upper side of a back panel, and the air is also guided from a vent provided on the substrate in the housing into the upper side of the housing.

The information processing equipment as shown in FIGS. 1 to 4 has a structure that the back panel 14 and the substrate units 12 are respectively perpendicularly arranged and the fans 28 are provided at the upper side and the lower side thereof, wherein air is blown perpendicularly to effect cooling, and such a cooling structure is generally employed. With such a cooling structure, in the case of a rack mount unit (assuming that units are mounted on a standard rack such as 19 inch rack), it is unclear what kind of units are installed in a vertical direction so that it is not appropriate to provide the intake port 20 or the exhaust port 26 in the vertical direction to secure a space where the units are provided. With such a requirement, a space for forming the intake duct 18 and the exhaust duct 24 is needed.

Each space between the substrate units 12 and the fans 28 has an intimate relation relative to a cooling effect of the substrate units 12, and if a sufficient space is not secured between the substrate units 12 and the fans 28, the flow of the passing air for cooling W is blocked so that air velocity is prominently biased depending on the position of each substrate unit 12.

Accordingly, the cooling structure having the fans 28 at the upper and lower sides of the substrate housing parts 8 wastes a space in which the fans 28 are installed, and requires a space (chamber) in the intake duct 18 and the exhaust duct 24 for restraining air velocity from being biased between the substrate units 12. If such a space is secured, the space lowers a mounting efficiency of the substrate units 12 and so forth in the direction of the height of the housing 2.

Meanwhile, each fan 28 has the structure, for example, as shown in FIG. 5, wherein a motor 34 is attached to each rotary axis of rotary blades 32. According to such an axial-flow fan, the volume of air is small at the central portion of the blades 32, but becomes large as the position is far from the central portion in the radial direction. That is, the characteristic of the axial-flow fan is small in air velocity at the central side area A, and large in velocity at an outer edge side area B. Accordingly, the air velocity is prominently biased between the central portion and the outer edge portion of the blades 32 in the vicinity of the fan 28, and hence it is inevitable to secure a space at the intake side of the fan 28 to prevent the air velocity from being biased.

The problem to improve a mounting efficiency while restraining the biasing of the air velocity is not disclosed in JP-A 2002-32148, and such a problem cannot be resolved even if the technique disclosed in JP-A 2002-32148 is referred to.

SUMMARY OF THE INVENTION

Accordingly, it is a first object of the invention to enhance cooling capacity of a cooling structure of an electronic equipment which needs forced-air-cooling by fans and so forth.

It is a second object of the invention to enhance a mounting efficiency of substrate units of a cooling structure of an electronic equipment which needs forced-air-cooling by fans and so forth.

It is a third object of the invention to enhance cooling capacity of an information processing equipment serving as an electronic equipment which needs forced-air-cooling by fans and so forth, and to provide an information processing equipment which enhanced mounting efficiency of the substrate units.

The cooling structure of the electronic equipment and the information processing equipment of the invention which resolved the problem are as follows.

To achieve the first and second objects of the invention, a cooling structure of an electronic equipment of the invention is the cooling structure of the electronic equipment which needs forced-air-cooling, and comprises, for example, as shown in FIGS. 6 to 20, substrate housing parts 106, an upstream side duct (intake duct 112), a downstream side duct (exhaust side duct 116), exhaust means (exhaust part 118, fans 122) and air adjusting means (air adjusting plates 126). The substrate housing parts 106 detachably house therein one or plurality of substrate units 108. The upstream side duct is provided at the upstream side of air for cooling W which is allowed to flow to the substrate housing parts, and the downstream side duct allows the air for cooling which passed from the upstream side duct through the substrate housing part 106 to flow. The exhaust means is provided at the exhaust part 118 for allowing the downstream side duct to open to an outside air to forcibly discharge air to the outside air, thereby allowing the air for cooling to flow to the substrate housing parts. The air adjusting means is means for adjusting the air for cooling which passes from the upstream side duct to the downstream side duct through the substrate housing parts.

With the cooling structure having such an arrangement, air in the substrate housing parts is forcibly discharged to the outer air by the exhaust air of the exhaust means, and hence the air for cooling is allowed to flow from the upstream side duct to the downstream side duct through the substrate housing parts, so that the substrate units in the substrate housing parts are cooled by the air for cooling. In this case, since the exhaust means is installed in the exhaust part of the downstream side duct, and the air for cooling is allowed to flow from the substrate housing parts and the upstream side duct through the downstream side duct so as to be sucked therethrough, air velocity which is not biased in the substrate housing parts is obtained to uniform distribution of air velocity irrespective of the position of the substrate units.

Then, the air for cooling which flows from the upstream side duct to the downstream side duct is adjusted by the air adjusting means, and the air adjusting means can adjust increase and decrease of the volume of air, air velocity or distribution of volume of air by increasing or decreasing the number of air openings, adjusting each diameter of the air openings, blocking the air openings and so forth, for example, relative to the uniform distribution of air velocity. As a result, it is possible to concentrate the volume of air to the substrate unit having high heating value, thereby achieving efficient and optimum cooling.

Further, according to the cooling structure of the invention, since a cooling space in a direction of a height thereof is realized by the height of the exhaust means and the height of the upstream side duct, it gets a small share of an entire volume comprising the substrate housing parts, the upstream side duct and the downstream side duct, thereby allowing the cooling structure to be compact. Still further, according to the cooling structure of the invention, since the exhaust means is installed in the exhaust part of the downstream side duct to allow the air for cooling to flow from the upstream side duct to the downstream side duct, spaces at the upper sides of the substrate housing parts can be reduced, the volume of the substrate housing part can be increased, and a mounting efficiency of the substrate units can be enhanced compared with the conventional cooling structure provided with fans at the upper and lower sides of the substrate housing parts.

To achieve the first and second objects of the invention, with the cooling structure of the electronic equipment of the invention, the air adjusting means is installed in either a first boundary part where the substrate housing parts and the downstream side duct contact each other or a second boundary part where the substrate housing parts and the upstream side duct contact each other, thereby adjusting the volume of entire air for cooling which flows to the substrate housing parts or adjusting the volume of air corresponding to the substrate units to be installed.

That is, the air adjusting means can adjust the volume of air of the air for cooling, for example, by changing or differentiating a flowing area of the air for cooling. With such an arrangement, it is possible to adjust air velocity or distribution of volume of air or volume or air of the air for cooling corresponding to the substrate units installed in the substrate housing parts by changing the flowing area, while exhaust performance of the exhaust means is not changed, thereby obtaining an optimum and efficient air for cooling. The air adjusting means may be formed of adjusting means for increasing or decreasing the volume of air corresponding to the substrate units to be installed.

To achieve the first and second objects of the invention, with the cooling structure of the electronic equipment of the invention, the air adjusting means may change exhaust capacity of the exhaust means. That is, if the exhaust capacity of the exhaust means is changed, the volume of the air corresponding to the exhaust capacity is obtained, thereby realizing the optimum cooling effect.

Further, with the cooling structure of the electronic equipment of the invention, first and second substrate housing frame bodies are detachably provided in the housing, and the substrate housing part may be installed in the substrate housing frame bodies. Still further, the air adjusting means may be structured to set the size or the number of air openings through which the air for cooling passes corresponding to the substrate units is allowed to pass. More still further, the cooling structure of the electronic equipment may be provided with a motor for driving the exhaust means, and control means for controlling a driving input relative to the motor to control the number of revolution.

To achieve the first and second objects of the invention, the cooling structure of the electronic equipment of the invention is a cooling structure of substrate units which need forced-air-cooling, and it comprises substrate housing parts 106, an upstream side duct (intake duct 112), a downstream side duct (exhaust side duct 116), first exhaust means (exhaust part 118, fans 122), a housing unit 132, and second exhaust means (exhaust part 138, fans 140). The substrate housing part detachably houses therein one or plurality of substrate units, the upstream side duct allows the air for cooling to flow to the substrate housing parts, and the downstream side duct allows the air for cooling which passed through the substrate housing part to flow. The first exhaust means is provided in the first exhaust part 118 for allowing the downstream side duct open to an outside air to forcibly discharge the air in the substrate housing parts to the outside air, thereby allowing the air for cooling to flow to the substrate housing parts. The housing unit is a unit which is detachably installed in the downstream side duct. The second exhaust means allows the air for cooling to flow from the downstream side duct into the housing unit by exhausting air from a second exhaust part 142 for allowing the housing unit to open to the outside air.

According to the cooling structure of the electronic equipment of the invention, the housing unit is detachably installed on the downstream side duct and an object to be cooled such as a power supply unit having high heating value and so forth can be housed in the housing unit. With such an arrangement, a power supply unit having high heating value and so forth can be cooled by the housing unit separately from the heat radiation or cooling of the substrate units, thereby improving cooling efficiency, and further since the housing unit is added to the components of the cooling structure of the electronic equipment, a mounting efficiency of the substrate units and so forth can be enhanced. Still further, since the housing units are installed in the downstream side duct, the volume of air of the air for cooling which flows to the substrate housing part and the downstream side duct can be adjusted. More still further, the air for cooling is allowed to flow from the substrate housing parts and the downstream side duct into the housing unit by the second exhaust means installed at the housing unit side, thereby supplementing the volume of air of the air for cooling which flows to the substrate housing part.

Still further, with the cooling structure of the electronic equipment of the invention, it may be structured to have an exhaust guide for intercepting exhaust air at the housing unit side from the downstream side duct by partitioning off the second exhaust part of the housing unit side and the downstream side duct.

More still further, to achieve the above objects, the cooling structure of the electronic equipment of the invention is the cooling structure of the electronic equipment which needs forced-air-cooling, and it may be composed of substrate housing parts installed in a housing to detachably house therein substrate units, an upstream side duct provided at the upstream side of air for cooling which is allowed to flow to the substrate housing parts, a downstream side duct for allowing the air for cooling, which passed through the substrate housing parts from the upstream side duct, to flow, an intake part for guiding the air for cooling to the upstream side duct, an exhaust part for exhausting the air for cooling from the downstream side duct, exhaust means provided at the exhaust part for forcibly discharging air in the substrate housing parts to an outside air to allow the air for cooling to the substrate housing parts, and air adjusting means for adjusting the air for cooling which flows from the upstream side duct to the downstream side duct through the substrate housing parts.

More still further, with the cooling structure of the electronic equipment of the invention, the housing unit is provided with an intake part which is allowed to open to the downstream side duct, and intake fans are installed at the intake part.

More still further, to achieve the above objects, the cooling structure of the electronic equipment of the invention is a cooling structure of the electronic equipment which needs forced-air-cooling, and it may be structured to comprise substrate housing parts for detachably housing therein substrate units from a wall face side of the housing, an upstream side duct provided at the upstream side of the air for cooling which is allowed to flow to the substrate housing parts, a downstream side duct for allowing the air for cooling which passed through the substrate housing parts to flow from the upstream side duct, a ventilation part provided at the wall face of the housing for allowing the upstream side duct to open to an outside air, a first exhaust part provided at the wall face of the housing for allowing the downstream side duct to open to the outside air, first exhaust means provided at the first exhaust part to forcibly discharge air in the housing to the outside air to allow the air for cooling to flow to the substrate housing parts, air adjusting means for adjusting the air for cooling which flows from the upstream side duct to the downstream side duct through the substrate housing part, a housing unit installed on the downstream side duct for housing a circuit unit, and second exhaust means provided in the housing unit or housing for exhausting air from the second exhaust part of the housing by allowing the air for cooling to flow to the housing units.

To achieve the third objects of the invention, the information processing equipment of the invention has a structure provided with the cooling structure of the electronic equipment. With such an arrangement, it is possible to enhance cooling efficiency and mounting efficiency of the substrate units, thereby contributing to the downsizing of the information processing equipment, and high function tendency caused by the improvement of mounting efficiency of the substrate units, to enhance reliability of the cooling structure of the electronic equipment.

Other objects, features and advantages of the invention can be more clarified with reference to the attached drawings and each embodiment of the invention.

BRIEF DESCRIPTION OF THE DRAWINGS

FIG. 12 is a longitudinal sectional view showing the housing unit;

DETAILED DESCRIPTION OF THE PREFERRED EMBODIMENT

First Embodiment

Figure 1:
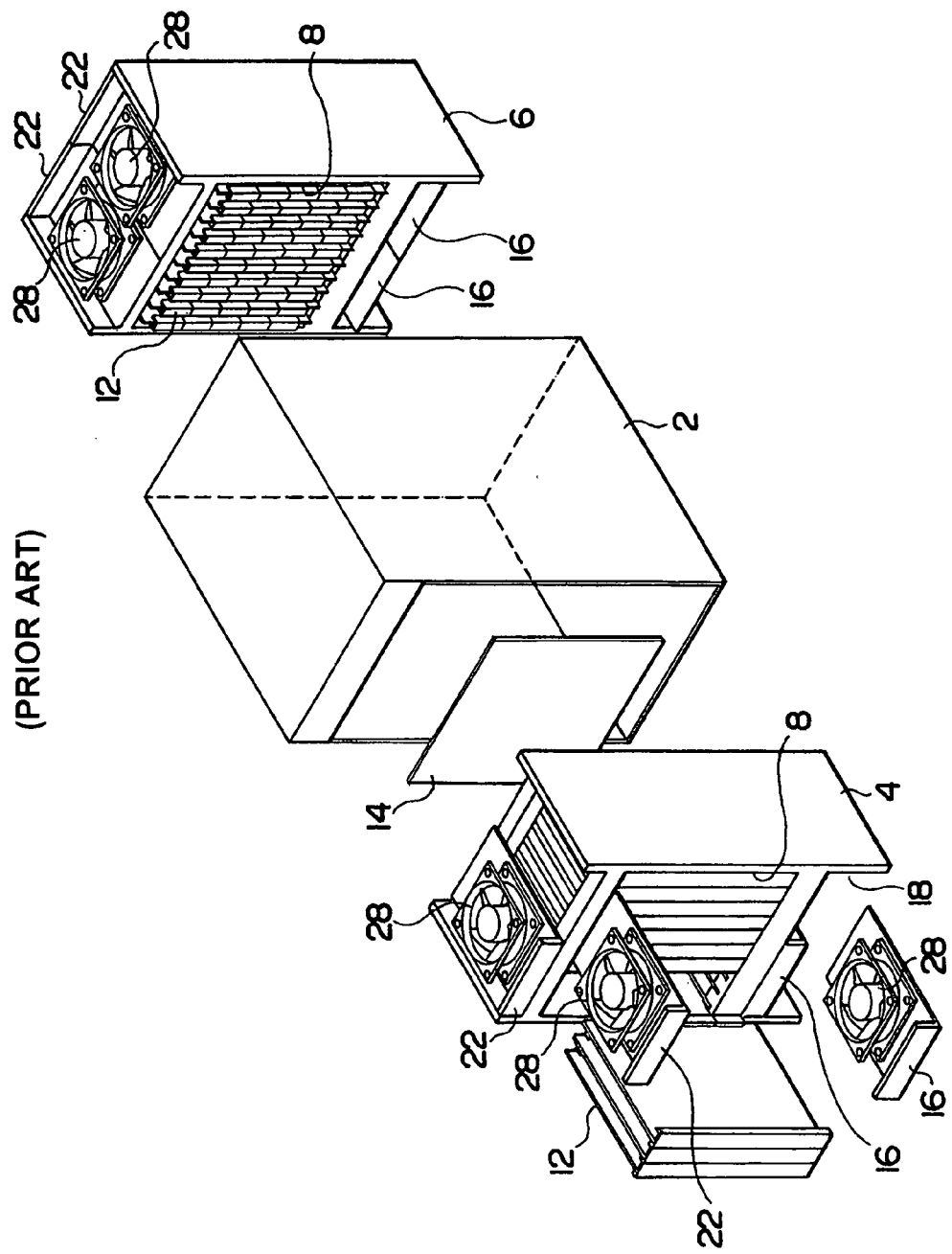
FIG. 1 is an exploded perspective view showing a conventional cooling structure of an electronic equipment.
Figure 2:
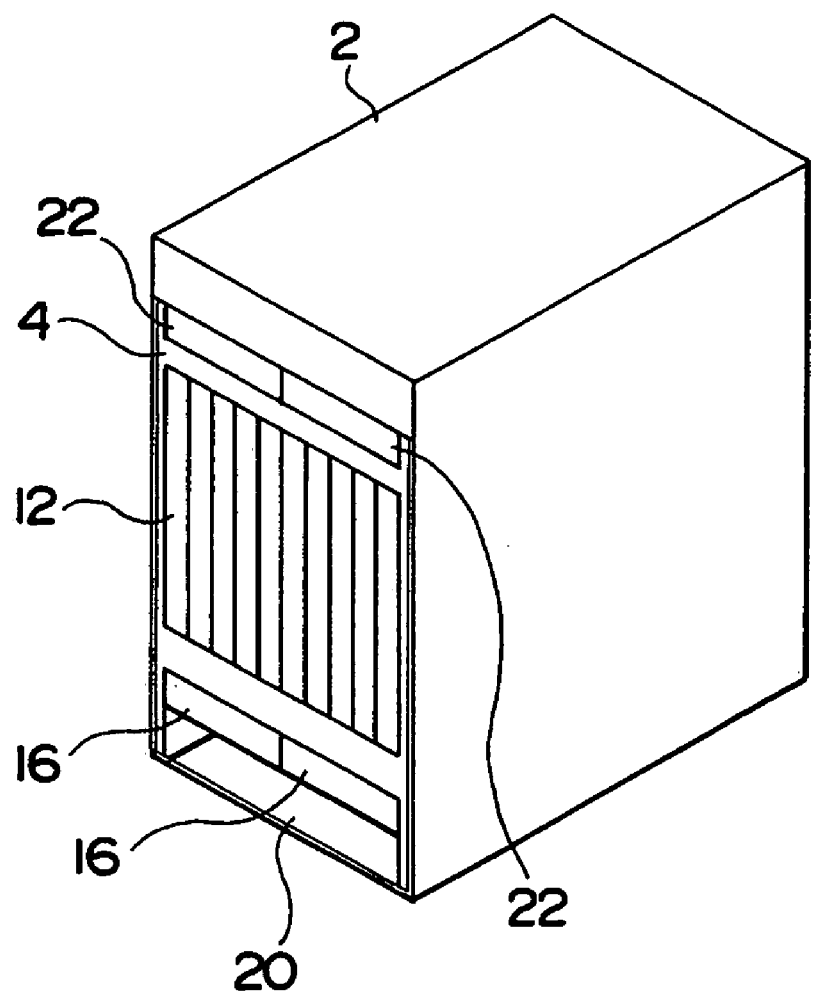
FIG. 2 is a perspective view of the conventional electronic equipment as viewed from the front face side thereof.
Figure 3:
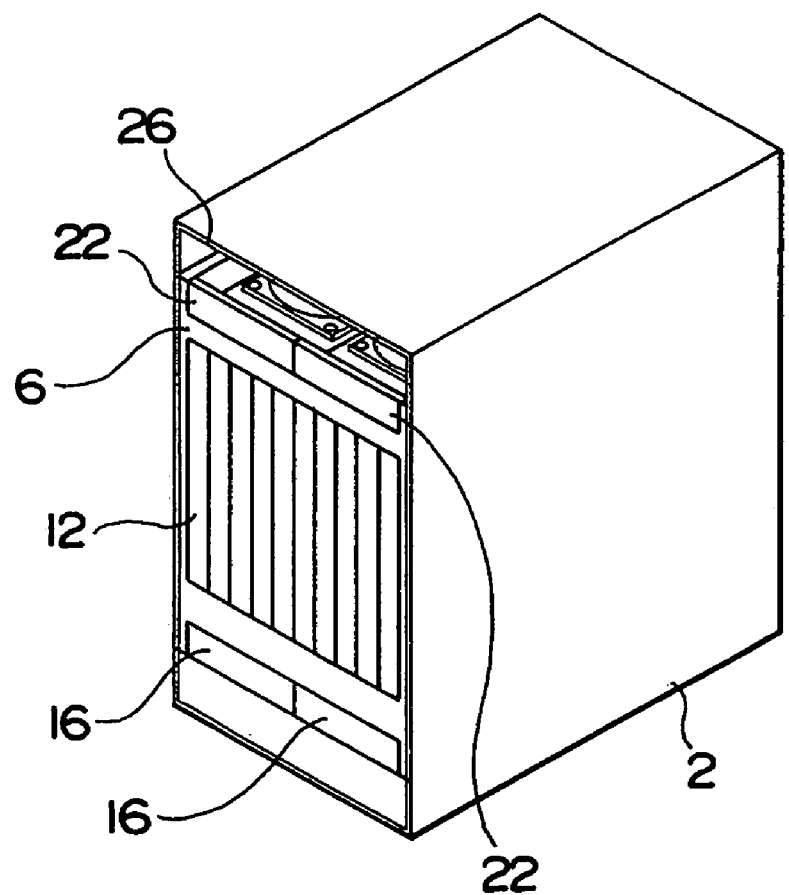
FIG. 3 is a perspective view of the conventional electronic equipment as viewed from the back face side thereof.
Figure 4:
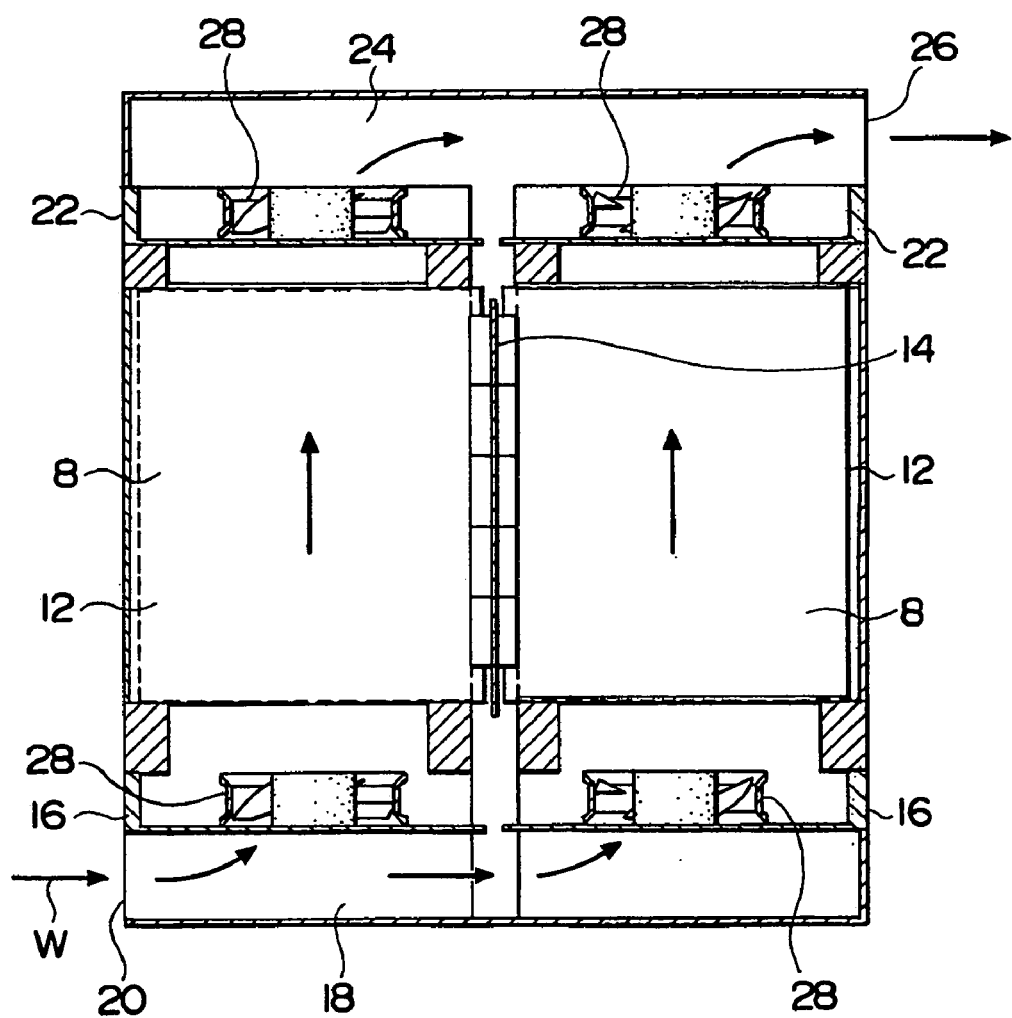
FIG. 4 is a longitudinal sectional view showing the flow of air for cooling in the conventional cooling structure of the electronic equipment.
Figure 5:
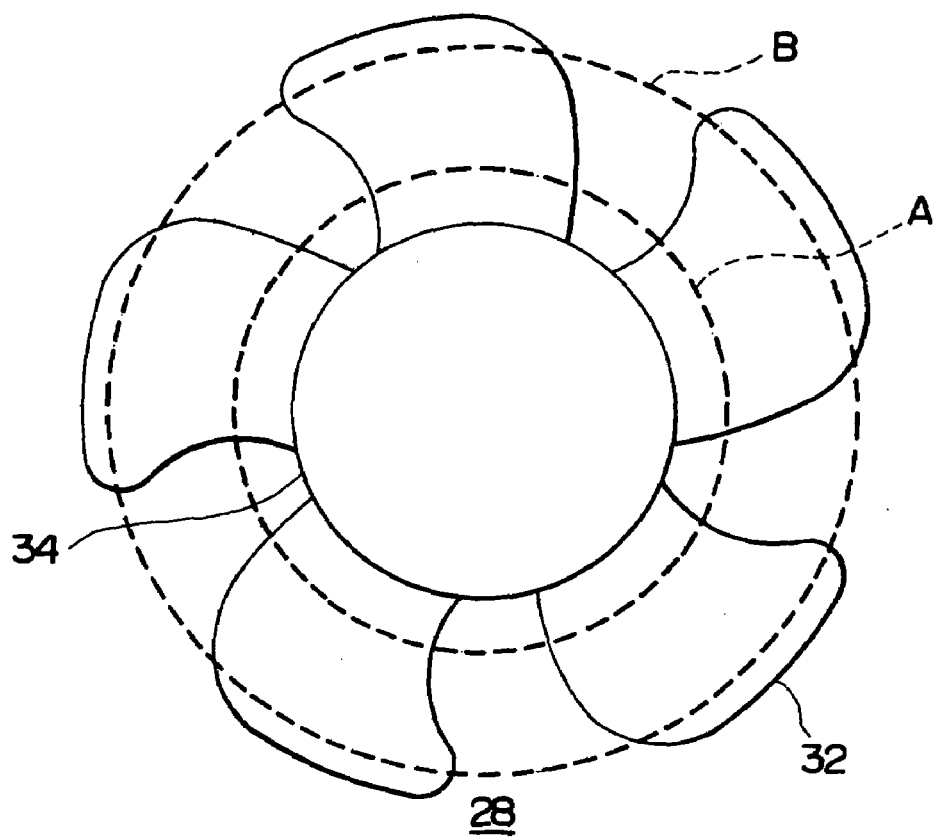
FIG. 5 is a view showing the distribution of volume of air of an axial-flow fan.
Figure 6:
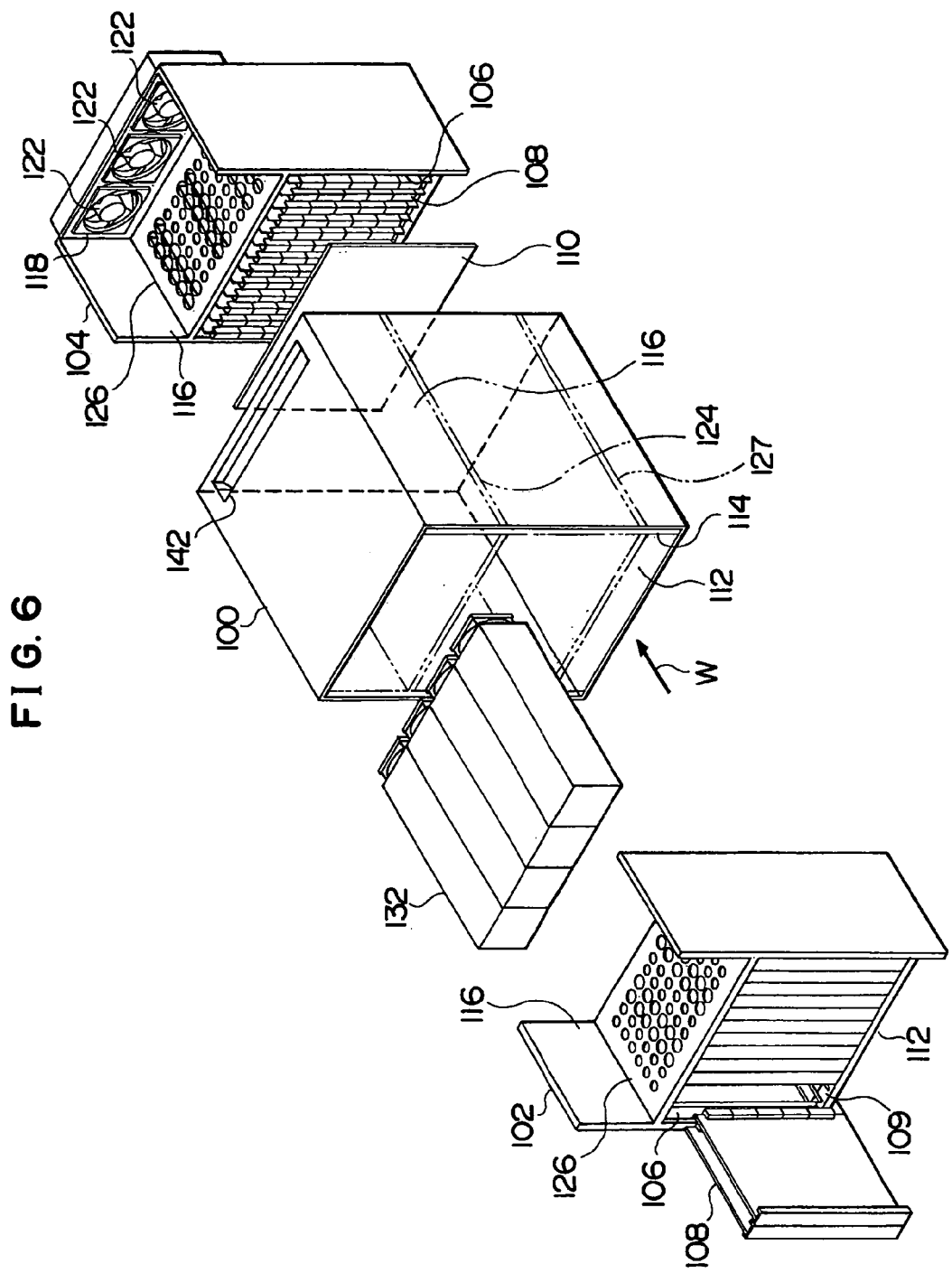
FIG. 6 is an exploded perspective view showing a cooling structure of the electronic equipment according to a first embodiment of the invention.
Figure 7:
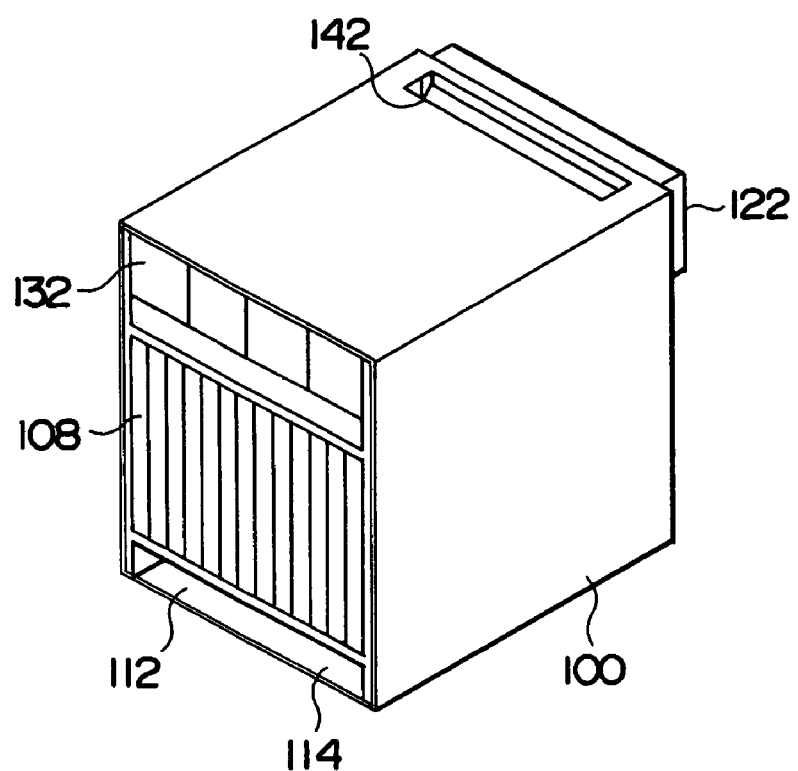
FIG. 7 is a perspective view of the electronic equipment of the first embodiment as viewed from the front face thereof.
Figure 8:
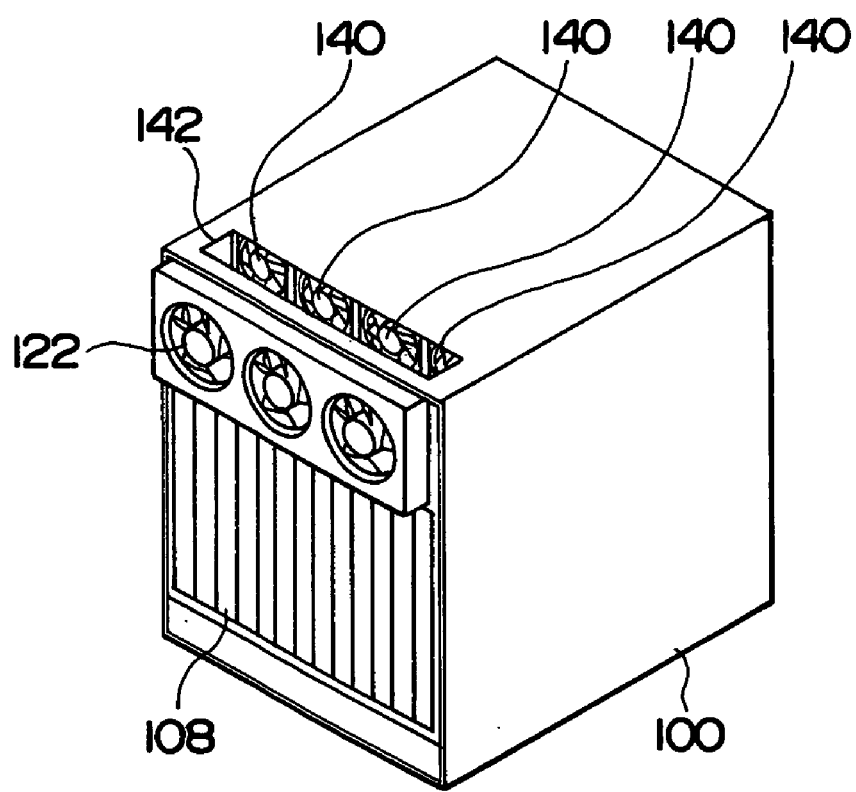
FIG. 8 is a perspective view of the electronic equipment of the first embodiment as viewed from the back face thereof.

FIGS. 6 to 8 show a cooling structure of the electronic equipment according to a first embodiment of the invention, wherein FIG. 6 is an exploded perspective view of a cooling structure in an information processing equipment, FIG. 7 is a perspective view of the information processing equipment provided with the cooling structure as viewed from the front face side and FIG. 8 is a perspective view of the information processing equipment provided with the cooling structure as viewed from the back face side.

The information processing equipment is provided with a rectangular parallelpiped housing 100 as a main enclosure, for example, made of a metallic material, wherein a front shelf 102 serving as a first substrate housing frame body is provided at a front side of the housing 100 and a back shelf 104 serving as a second substrate housing frame body provided at a rear side thereof. Substrate housing parts 106 are individually installed in the shelves 102, 104, and one or plurality of substrate units 108, onto which various circuit units such as electronic equipment and so forth are mounted, are detachably housed in the substrate housing parts 106. Guides 109 are installed in the shelves 102, 104, and the substrate units 108 are mounted in the substrate housing parts 106 while guided by the guides 109. In this case, the substrate units 108 are housed in the front shelf 102 side from the front part thereof and the substrate units 108 are housed in the back shelf 104 from the rear part thereof. The substrate housing parts 106 of the shelves 102, 104 are partitioned by a back panel 110 installed at the rear part side of the front shelf 102.

An intake side duct 112 serving as an upstream side duct is installed in common to the shelves 102, 104 at the upstream side of the substrate housing parts 106. The intake side duct 112 is open to an outside air through a first intake part 114 provided at the front shelf 102 side. That is, the first intake part 114 is a window for intake air.

An exhaust side duct 116 serving as an downstream side duct is installed in common to the shelves 102, 104 at the downstream side of the substrate housing parts 106. The exhaust side duct 116 is open to the outside air through a first exhaust part 118 provided at the back shelf 104. That is, the first exhaust part 118 is a window for exhaust air. One or plurality of fans 122, for example, made up of an axial-flow fan, are installed in the first exhaust part 118, serving as first exhaust means for allowing the air in the housing 100 to forcibly discharge, thereby allowing air for cooling W to flow to the substrate housing parts 106. According to this embodiment, three sets of fans 122 are installed to secure the air for cooling W having necessary volume.

Air adjusting plates 126 serving as air adjusting means for adjusting the air for cooling W which flows toward the exhaust side ducts 116 through the substrate housing parts 106 are respectively installed in the shelves 102, 104 at a first boundary part 124 where the exhaust side duct 116 and substrate housing parts 106 contact each other. The air adjusting plates 126 serving as air adjusting means for adjusting the air for cooling W may be installed at a second boundary part 127 where the intake side duct 112 and the substrate housing parts 106 contact each other, and they may be installed at the first and second boundary parts 124, 127.

Figure 9:
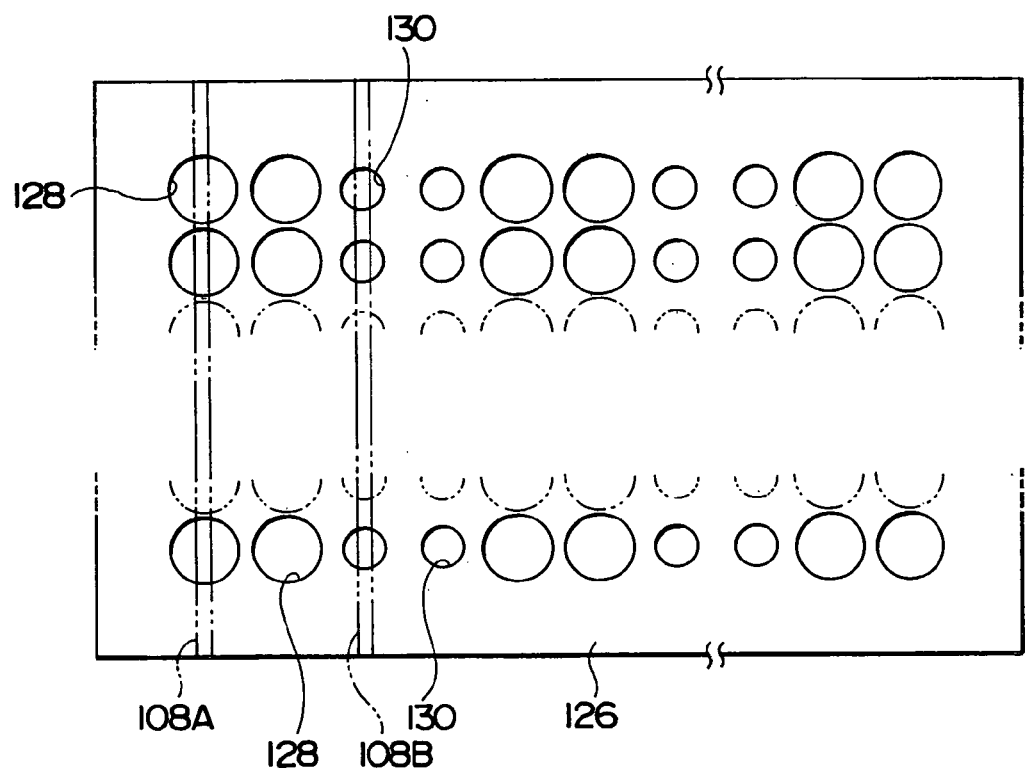
FIG. 9 is a plan view of an air adjusting plate in the electronic equipment of the first embodiment, a part of which is omitted.

The air adjusting plates 126 are made of a metallic material sheet same as the shelves 102, 104, wherein they have a plurality of air openings 128 each having a large diameter and a plurality of air openings 130 each having a small diameter which are formed regularly, for example, as shown in FIG. 9. FIG. 9 is a plan view showing an example of the air adjusting plates 126. The positional relation between the air openings 128, 130 and the substrate units 108A, 108B are set depending on the heating value such that according to the air openings 128, 130 installed in the air adjusting plates 126, the air openings 128 each having a large diameters correspond to a substrate unit 108A having a high heating value and the air openings 130 each having a small diameter correspond to a substrate unit 108B having a low heating value. With such an arrangement, the air for cooling W can be allowed to flow to the substrate housing parts 106 while forming the volume of air and the distribution of air velocity corresponding to the heating value of the substrate units 108A, 108B and so forth.

Figure 10:
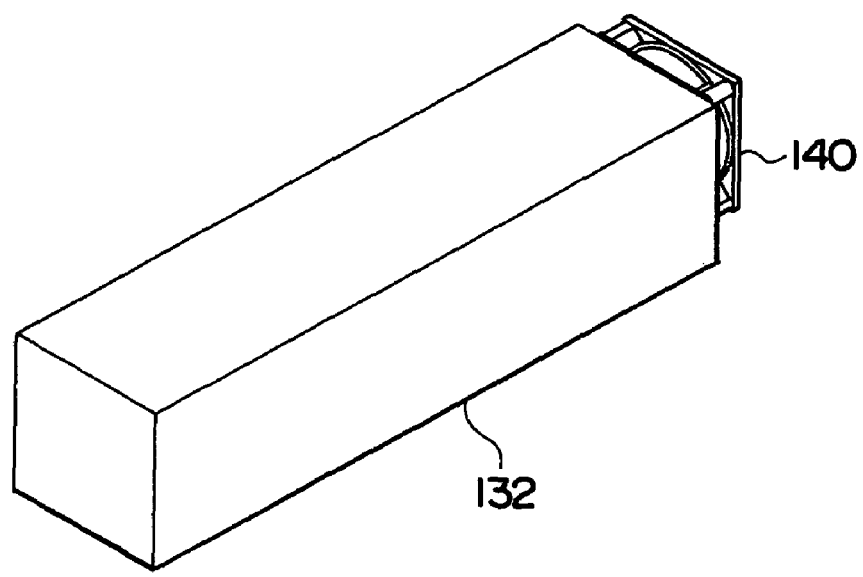
FIG. 10 is a perspective view of the housing unit as viewed from the front face side thereof.
Figure 11:
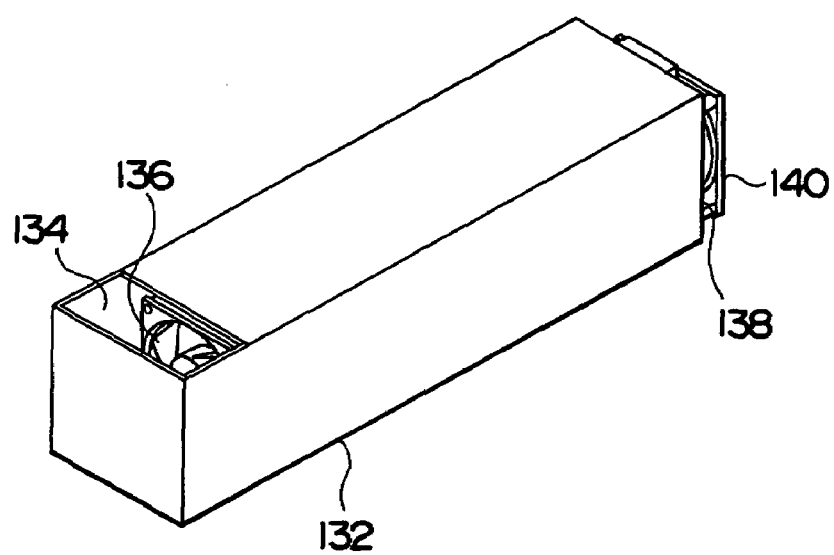
FIG. 11 is a perspective view of the housing unit as viewed from the under face side thereof.

One or plurality of housing units 132 serving as a subunit for effecting a forced-air-cooling are installed in the exhaust side duct 116 separately from the substrate units 108 such as a power supply unit and so forth, wherein the housing unit 132 are detachably installed in the exhaust side duct 116 from the front face side of the housing 100. According to this embodiment, although five sets of housing units 132 are installed, one set of housing unit 132 may be installed to block an opening produced at the font face side thereof. The housing unit 132 is configured, for example, as shown in FIGS. 10 to 12, wherein FIG. 10 is a perspective view of the housing unit 132 as viewed from a front face side thereof, FIG. 11 is a perspective view of the housing unit 132 as viewed from a lower face side thereof, and FIG. 12 is a longitudinal sectional view of the housing unit 132.

In this case, each of the housing units 132 is pillar cylindrical body wherein the front part side is blocked and a second intake part 134 which is open at the exhaust side duct 116 is provided at the lower face part of the front face side thereof. The second intake part 134 is a window for allowing the housing units 132 to open toward the exhaust side duct 116. A fan 136 for forcibly drawing the air for cooling WB from the second intake part 134 to the interior of the housing units 132 is installed inside the second intake part 134. Further, an exhaust part 138 serving as second exhaust means provided in the housing unit or housing for exhausting the air for cooling W in the housing units 132 and a fan 140 are installed at the rear part of the housing units 132.

A second exhaust part 142 corresponding to the exhaust part 138 of the housing units 132 is formed in the housing 100. The second exhaust part 142 is a window for allowing the housing units 132 to open to the outside air. The second exhaust part 142 is installed on the different faces of the housing 100, namely, the first exhaust part 118 is installed at the back face part of the housing 100 and the second exhaust part 142 is installed at a ceiling face, such that exhausting directions thereof do not cross each other so that an exhaust effect of the first exhaust part 118 and second exhaust part 142 is enhanced.

Figure 13:
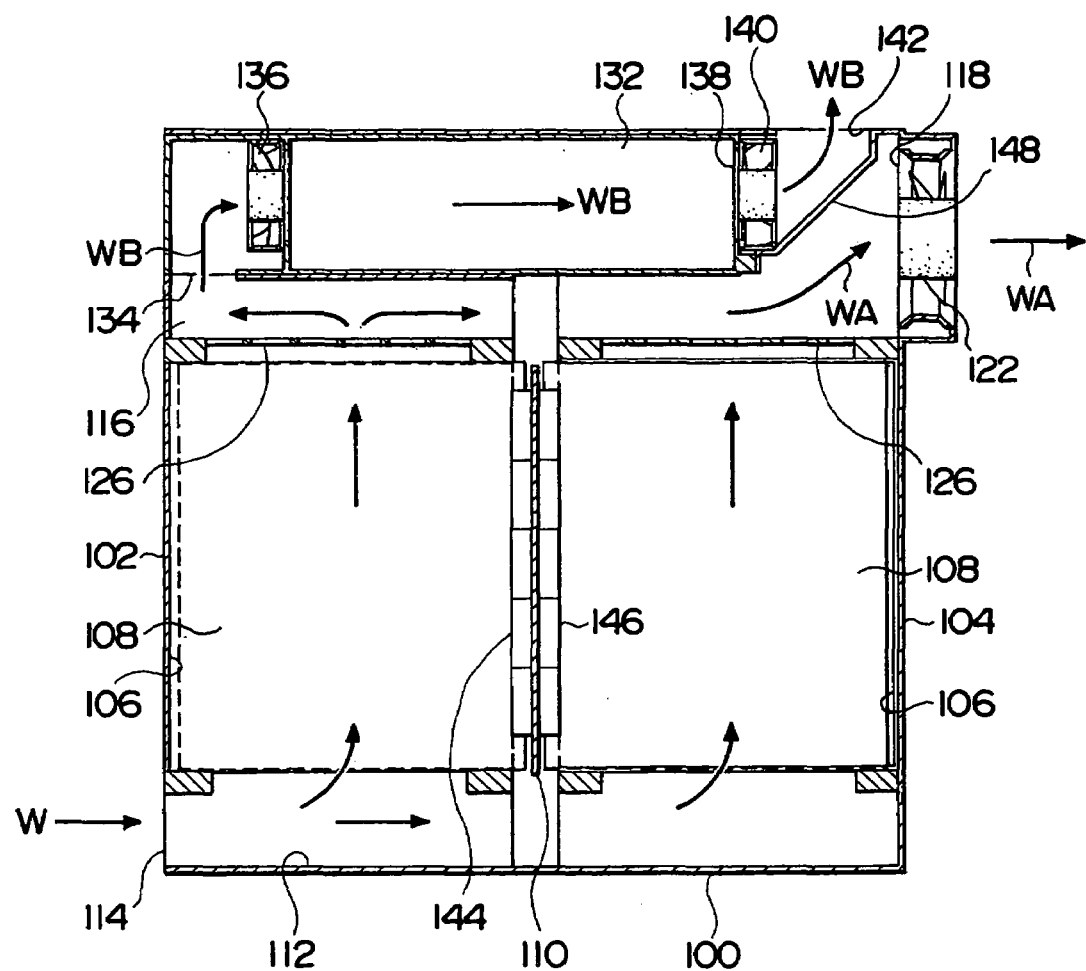
FIG. 13 is a longitudinal sectional view showing the flow of air for cooling in the cooling structure of the electronic equipment according to the first embodiment.

As shown in FIG. 13, for example, the front shelf 102 and the back shelf 104 are installed in the housing 100 via the back panel 110 and the housing units 132 is installed in the exhaust side duct 116 to structure the cooling structure. FIG. 13 is a longitudinal sectional view showing the cooling structure. Connectors 144, 146 are provided on the front face and back face of the back panel 110, wherein the substrate units 108 at the front shelf 102 side are inserted into the connector 144 to electrically connect therebetween while the substrate units 108 at the back shelf 104 side is inserted into the connector 146 to electrically connect therebetween.

According to this embodiment, there is installed an exhaust guide 148, which connects the exhaust part 138 of the housing units 132 to the second exhaust part 142 at the housing 100 side for exhausting air, in the exhaust side duct 116 of the housing 100. The exhaust guide 148 is structured to serve as guide means for guiding exhaust air from the housing units 132 to the second exhaust part 142 while separating from the exhaust air at the exhaust side duct 116 side, also to serve as supporting means for supporting the housing units 132 in the housing 100. That is, the air for cooling W at the substrate housing parts 106 side is divided into air for cooling WA at the exhaust side duct 116 side and air for cooling WB at the housing units 132 side, wherein the air for cooling WA is independently exhausted to the outer air by means of the first exhaust part 118 and the fans 122 while the air for cooling WB is independently exhausted to the outer air by means of the exhausts parts 138, 142 and the fan 140

Figure 14:
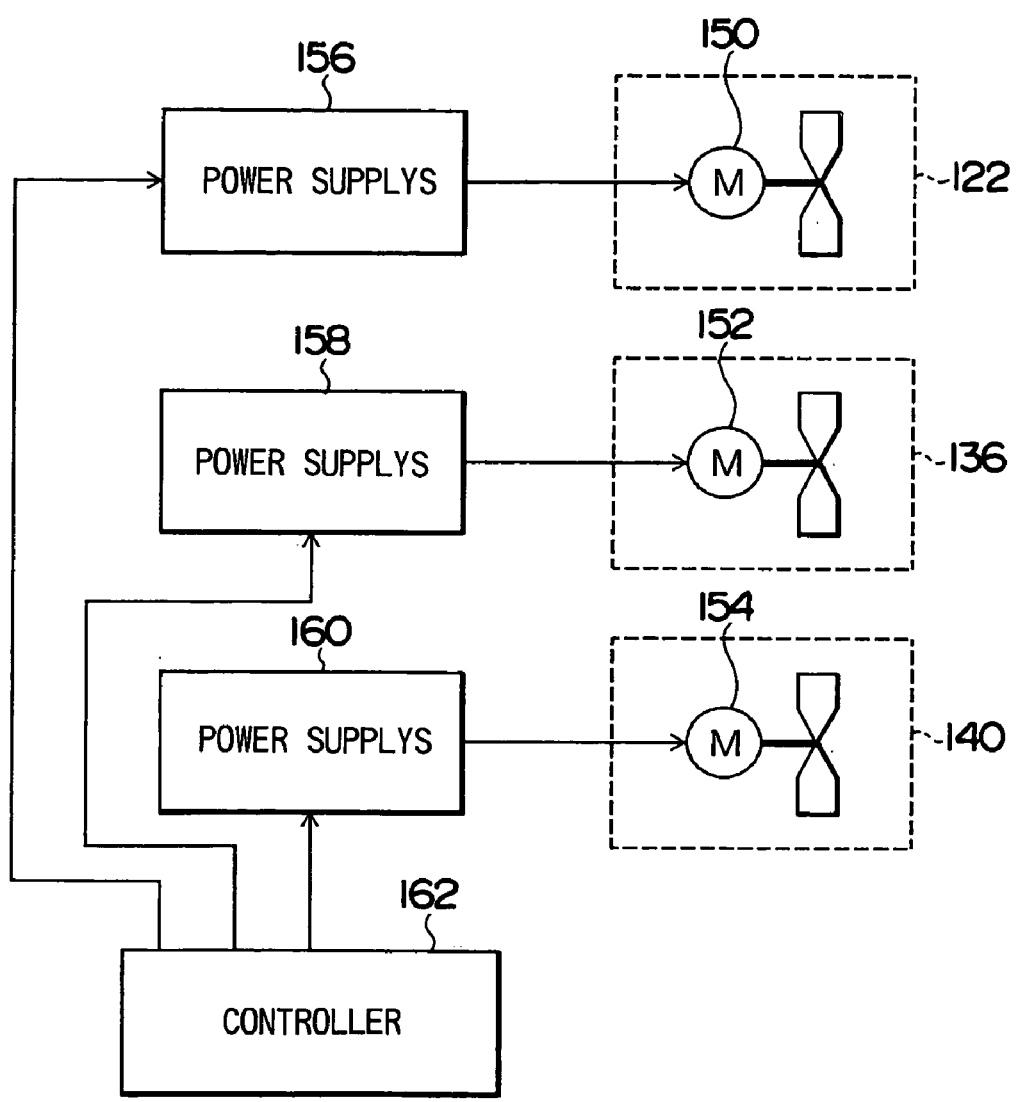
FIG. 14 is a block diagram showing a driving system of fans.

Further, as shown in FIG. 14, for example, independent power supplies 156, 158, 160 are connected to motors 150, 152, 154 of the fans 122, 136, 140 for supplying power to the motors 150, 152, 154, wherein the power supplies 156, 158, 160 are controlled in supply of power by a controller 162 serving as control means for controlling exhaust capacity, and the number of revolutions of the motors 150, 152, 154 can be adjusted. In this case, although the fans 122, 136, 140 are structured by each set thereof, multiple sets of the axial-flow fan are installed in parallel with one another, and they may be driven by independent power supplies. With such an arrangement, safety efficiency can be enhanced.

As mentioned above, according to the cooling structure of this embodiment, when the fans 122 are rotated in a direction to draw air from the housing 100, the air for cooling W is drawn from the first intake part 114 into the intake side duct 112, and it passes through the substrate housing parts 106 and flows from the exhaust side duct 116 into the first exhaust part 118, and finally it is discharged to the outer air as shown in FIG. 13. As a result, the substrate units 108 of the substrate housing parts 106 are cooled.

Figure 15:
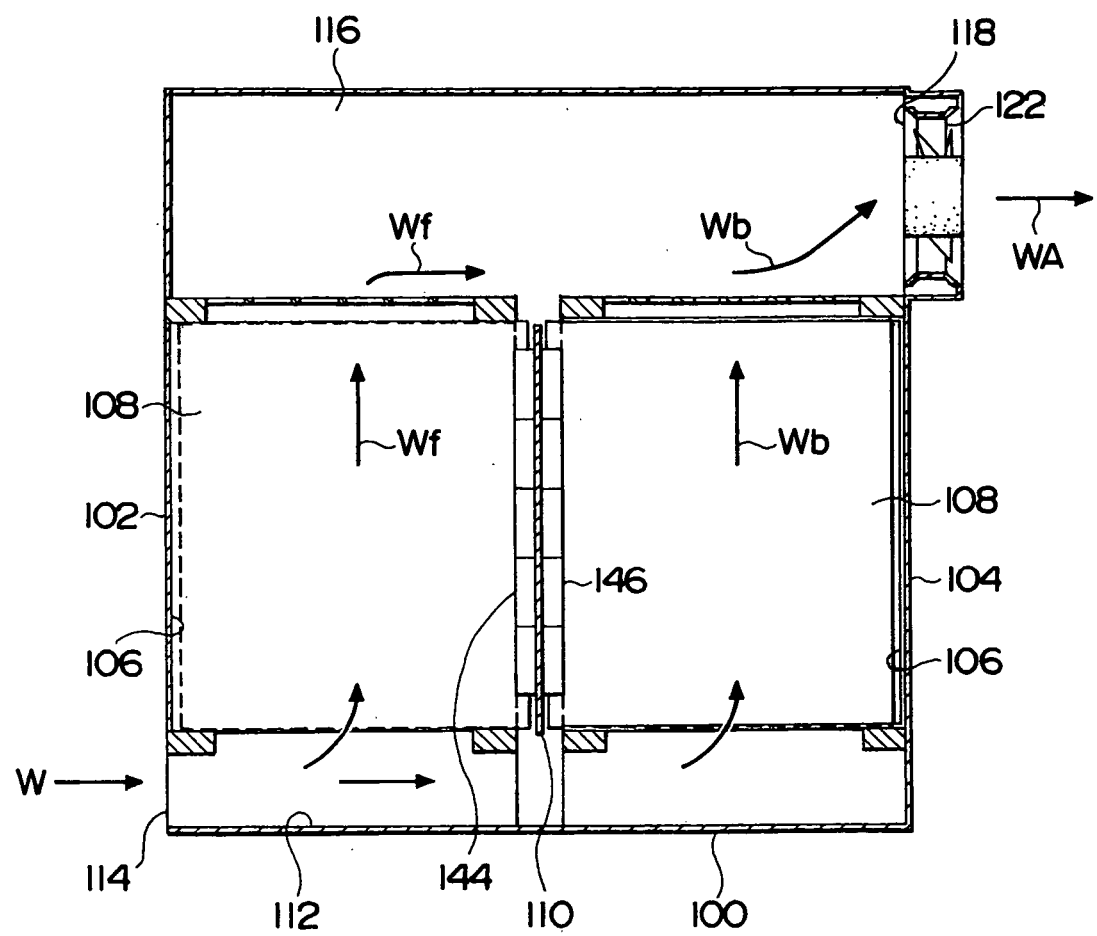
FIG. 15 is a view for explaining the flow of air for cooling.

Incidentally, assuming a state where the housing units 132 is removed from the exhaust side duct 116 as shown in FIG. 15, it is possible to sufficiently cool both the shelves 102, 104 by the volume of air by drawing air using the fans 122 obtaining sufficient volume of air relative to both the front shelf 102 and back shelf 104. In this case, since the shelves 102, 104 have rack mount structures, an interval between upper and lower plates is determined to some extent, it is possible to arrange a circuit unit on the upper and lower plates and cool it by setting the surfaces of the upper and lower plates to be flat.

In this case, viewing the relation between the front and back shelves 102, 104 installed at the lower surface side of the exhaust side duct 116 and the fans 122, and the volume of air (air for cooling Wb) at the back shelf 104 side close to the fans 122 is compared with the volume of air (air for cooling Wf) at the front shelf 102 side remote from the fans 122, the volume of air at the front shelf 102 side which is remote from the fans 122 becomes small (Wf<Wb). In this case, if the interval of the exhaust side ducts 116 at the upper portion of the front shelf 102 is narrower, it is possible to uniformize between the volume of air at the front shelf 102 side and that at the back shelf 104 side.

Figure 16:
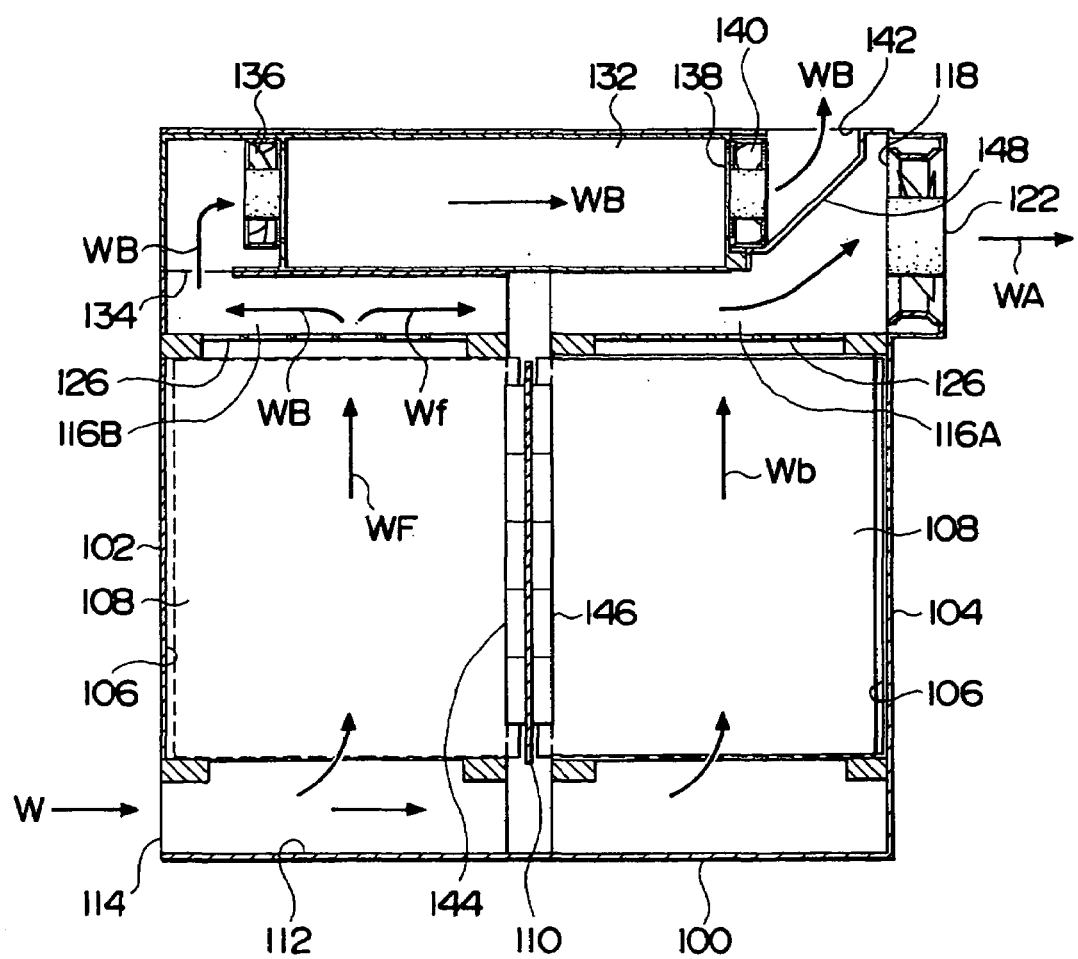
FIG. 16 is a view for explaining the flow of air for cooling.

Accordingly, with the first embodiment, the exhaust side duct 116 is not merely narrowed, but the housing unit 132 serving as a separate unit is installed in the exhaust side duct 116, thereby enhancing utilization efficiency of the space of the exhaust side duct 116, and realizing uniformization between the volume of air at the front shelf 102 side and that at the back shelf 104 side. That is, as shown in FIG. 16, the housing unit 132 is installed in the exhaust side duct 116, wherein a space of the upper portion side duct 116B of the front shelf 102 is narrowed by provision of the housing unit 132 compared with the upper portion side duct 116A of the back shelf 104, and hence the volume of air at the front shelf 102 side and that at the back shelf 104 side are uniformized.

The circuit unit to be cooled and so forth can be installed in the housing units 132 and utilized, and the fans 136, 140 are installed in the housing units 132 to structure a separate exhaust mechanism, wherein the suction force of this exhaust mechanism, namely, the fans 136, 140 can gain the volume of air at the front shelf 102 side through the upper portion side duct 116B. When the fans 122, 136, 140 are rotated, the volume of air (air for cooling WA) by the fans 122 is made up of the volume of air (air for cooling Wb) at the back shelf 104 side and a part of the volume of air (air for cooling Wf) at the front shelf 102 side whereas the volume of air (air for cooling Wf) at the front shelf 102 side is obtained by adding the volume of air (air for cooling WB) at the side of the housing units 132 side to the volume of air (air for cooling Wf) flowing to the fans 122 side.

Figure 17:
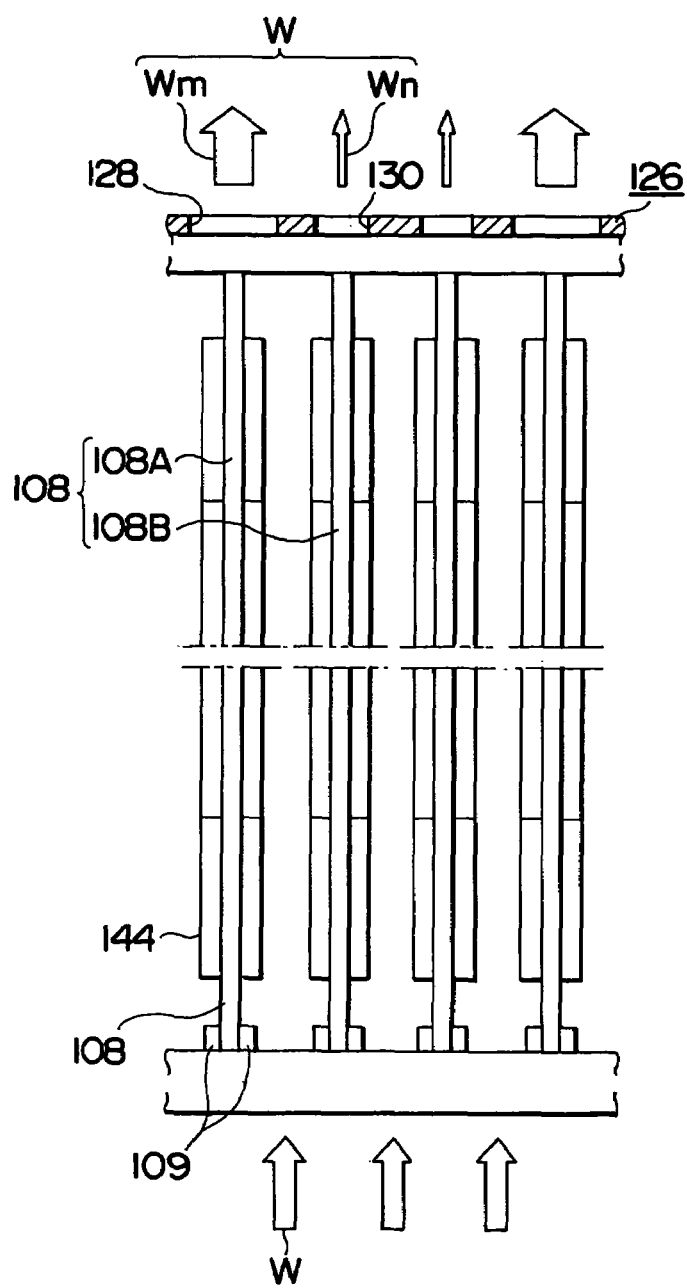
FIG. 17 is a view showing air adjusting operation by the air adjusting plate.

With the cooling structure of the this embodiment, since the air adjusting plates 126 are installed, for example, as shown in FIG. 17, the volume of air Wm of the air for cooling W at the air openings 128 having large diameter side increases compared with the volume of air Wn of the air for cooling W at the air openings 130 having small diameter side, and the air velocity of the former also increases, and hence the air velocity and volume of air can be adjusted by the air openings 128, 130, thereby obtaining desired cooling effect. Accordingly, optimum cooling can be effected with the air velocity and volume of air corresponding to the substrate unit 108A having high heating value and the substrate unit 108B having low heating value of the substrate units 108.

When the fan 140 of the housing units 132 installed in the exhaust side duct 116 is rotated in a direction to suck out air from the housing units 132, the air for cooling WB is drawn from the exhaust side duct 116 into the housing units 132, and passes through the housing units 132, then it is exhausted to the outer air through the exhaust parts 138, 142. As a result, the substrate units, power supply unit, and so forth in the housing units 132 are cooled.

In this case, the fan 136 is installed in the second intake part 134 side, the drawing of the air for cooling WB in the housing units 132 becomes excellent, thereby increasing the volume of air at the housing units 132. This contributes to the increase of the amount of exhaust of the air for cooling W at the substrate housing parts 106 side.

Since the housing unit 132 is installed in the exhaust side duct 116, the inner capacity of the exhaust side duct 116 lowers, however the suction capacity of the air for cooling W at the substrate housing parts 106 side is enhanced owing to the suction and drawing of air by the fans 136, 140 installed in the housing unit 132 so that the lowering of the exhaust capacity and exhaust capacity of the exhaust side duct 116 side are supplemented, thereby reinforcing the exhaust capacity. As a result, the cooling inside the housing unit 132 reinforces the cooling effect of the substrate units 108.

In this case, even if the performance of the fans 122 lowers or stops, if the fans 136, 140 in the housing unit 132 are rotated, the air for cooling W in the substrate housing part 106 can be exhausted from the second exhaust part 142 through the housing units 132, thereby cooling the substrate units 108.

Further, since the air adjusting plates 126 are installed, the volume of air and air velocity of the air for cooling W in the substrate housing parts 106 can be adjusted by the opening areas of the air openings 128, 130, and the flow path of air can be also adjusted by the positions of the openings. For example, if the number of the revolution of the motors 150 to 154 is controlled, the volume of entire air for cooling W at the substrate housing parts 106 side or the volume of air of the air for cooling WB at the housing unit 132 side can be increased or decreased or adjusted.

Although the first embodiment discloses the cooling structure provided with (1) the air adjusting plates 126 to adjust the air for cooling W, and also provided with (2) the housing units 132 capable of effecting forced-air-cooling independently at the exhaust side duct 116 of the housing 100, the cooling structure of the electronic equipment of the invention may be structured by either of (1) or (2) or both the (1) and (2) as set forth in this embodiment. More in detail, the cooling structure of the electronic equipment of the invention can be established by the first structure mode wherein the air adjusting plates 126 are installed to adjust the air for cooling W (namely, the housing units 132 are not installed in the first embodiment), the second structure mode wherein the housing units 132 are installed in the exhaust side duct 116 (namely, the air for cooling W is allowed to pass without providing the air adjusting plates 126), the third structure mode wherein the air for cooling W is adjusted by providing the air adjusting plates 126 and the housing units 132 capable of effecting forced-air-cooling are installed in the exhaust side duct 116 (first embodiment).

Figure 18A:
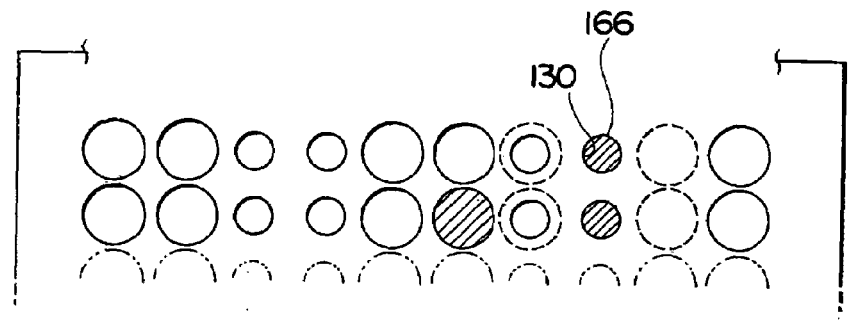
FIG. 18A is a plan view of the air adjusting plate, a part of which is omitted.

According to the first embodiment, although the air adjusting plates 126 in which a plurality of large and small air openings 128, 130 are regularly arranged are explained, the air openings 128, 130 of the air adjusting plates 126 may be structured to adjust the air openings 128, 130, for example, as shown in FIG. 18A. FIG. 18A is a plan view showing an embodiment for adjusting the air openings 128, 130 of the air adjusting plates 126.

Figure 18B:
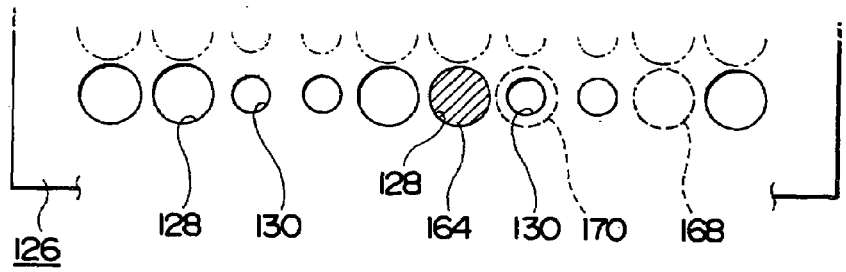
FIG. 18B is a sectional view showing the adjustment of air openings.
Figure 18B:
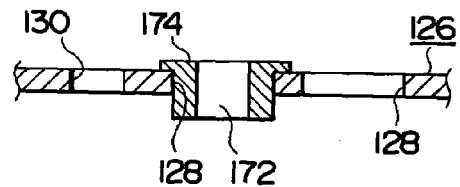
Figure 18C:
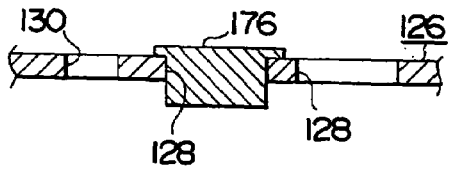
FIG. 18C is a sectional view showing closing of the air openings.

The air openings 128, 130 may be structured to be blocked, for example, by block plates 164, 166, as shown in hatched lines or may be formed of air openings 168 which are operable, if need be as shown by a broken line, or the air openings 130 may be changed to a large diameter air openings 128 by forming a cut 170 which can be punched out at the periphery of the small diameter air openings 130. Further, an adjustment fitter 174 having a small diameter air opening 172 may be detachably installed in the air openings 128 having a large diameter so that the air openings 128 may be changed to the air openings 172 having a small diameter of the adjustment fitter 174, as shown in FIG. 18B, or for example, a block fitter 176 for closing the air opening 128 having a large diameter may be detachably installed as shown in FIG. 18C. Still further, a similar block fitter may be detachably installed in the air openings having a small diameter so as to close the air openings 130 having small diameter. With such an arrangement, the air for cooling W having the volume of air corresponding to heating value can be allowed to flow to the substrate units 108 and so forth by a simple adjusting operation at the air adjusting plates 126 side.

With the cooling structure of the electronic equipment as set forth above, since the air for cooling W is sucked out from the substrate housing parts 106 by providing one or a plurality of fans 122 in the first exhaust part 118 of the housing 100, air velocity and the volume of air which are not biased or less biased can be obtained from the air for cooling W flowing to the substrate housing parts 106 irrespective of the positions of the substrate units 108, the cooling space of the housing 100 in the direction of the height thereof can be reduced to the size of the exhaust side duct 116 and the intake side duct 112 corresponding to the outer configuration of the fans 122, which enhances the downsizing and compactness of the housing 100 compared with the conventional cooling structure so that the ratio occupied by the substrate housing parts 106 in the housing 100 becomes large to enhance mounting efficiency of the substrate units 108. In this case, although the number of mounting is restricted by concentrating the portion where the fans 122 are installed, it is possible to uniformize the volume of air and the distribution of air velocity, air adjustment by the air adjustment plates 126, for example, by concentrating the volume of air at the substrate units 108A of high heating (FIG. 17), thereby supplementing the lowering of the amount of entire air by controlling the necessary air velocity and the volume of air, which does not practically present any problem.

Further, the fans 136 at the intake part 134 side and the fans 140 at the exhaust part 138 side are separately installed in the housing units 132 serving as a subunit, wherein the air for cooling W which passes through the substrate units 108 of the substrate housing parts 106 is drawn by the rotation of the fans 136, 140, thereby supplementing the air velocity and the volume of air on the substrate units 108 at the upstream side, thereby reinforcing the cooling effect of the substrate units 108.

The units such as power supply unit and so forth other than the substrate unit 108 can be mounted on the housing units 132 installed on the exhaust side duct 116, and the space of the exhaust side duct 116 can be efficiently utilized as a mounting space of the other substrate units and so forth, thereby improving the mounting efficiency of the substrate units and so forth.

Second Embodiment

Figure 19:
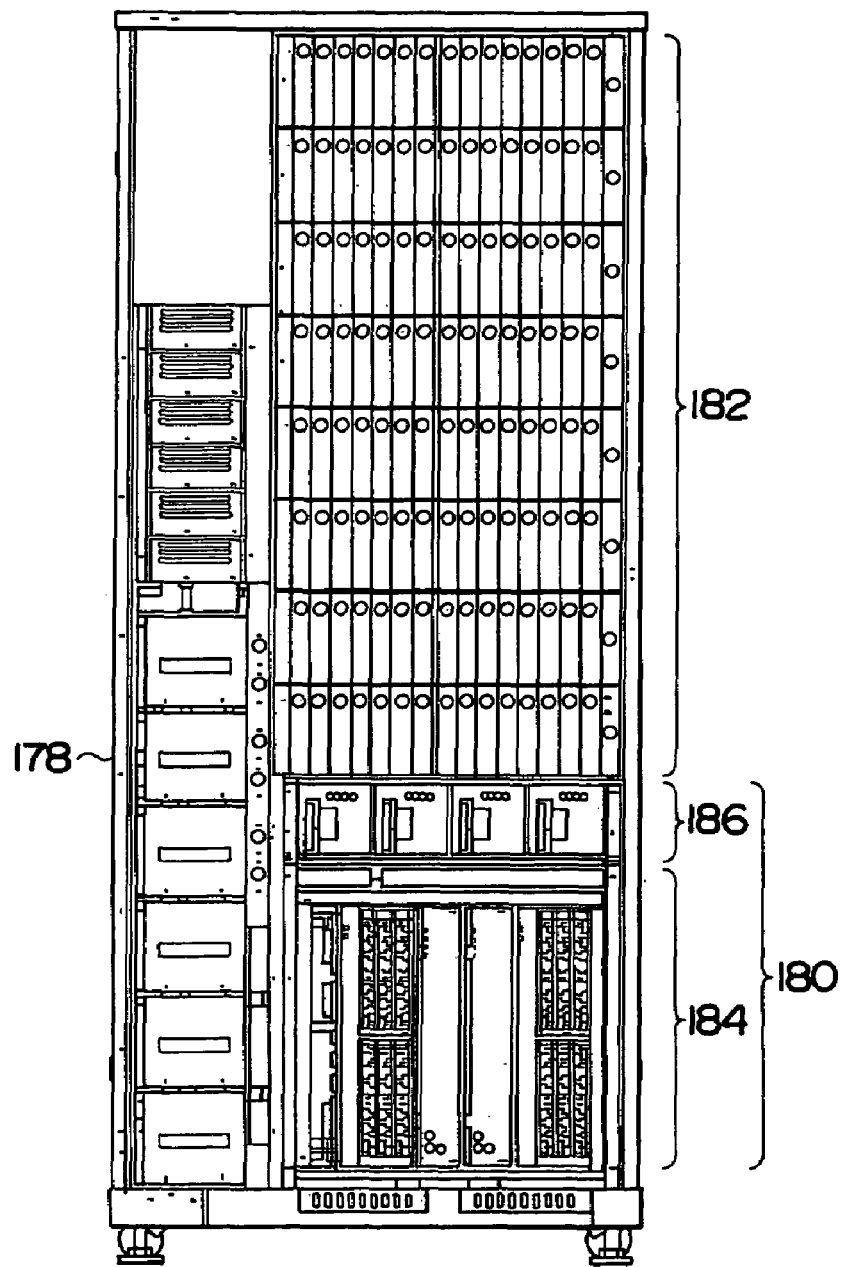
FIG. 19 is a front view showing an information processing equipment according to a second embodiment of the invention.
Figure 20:
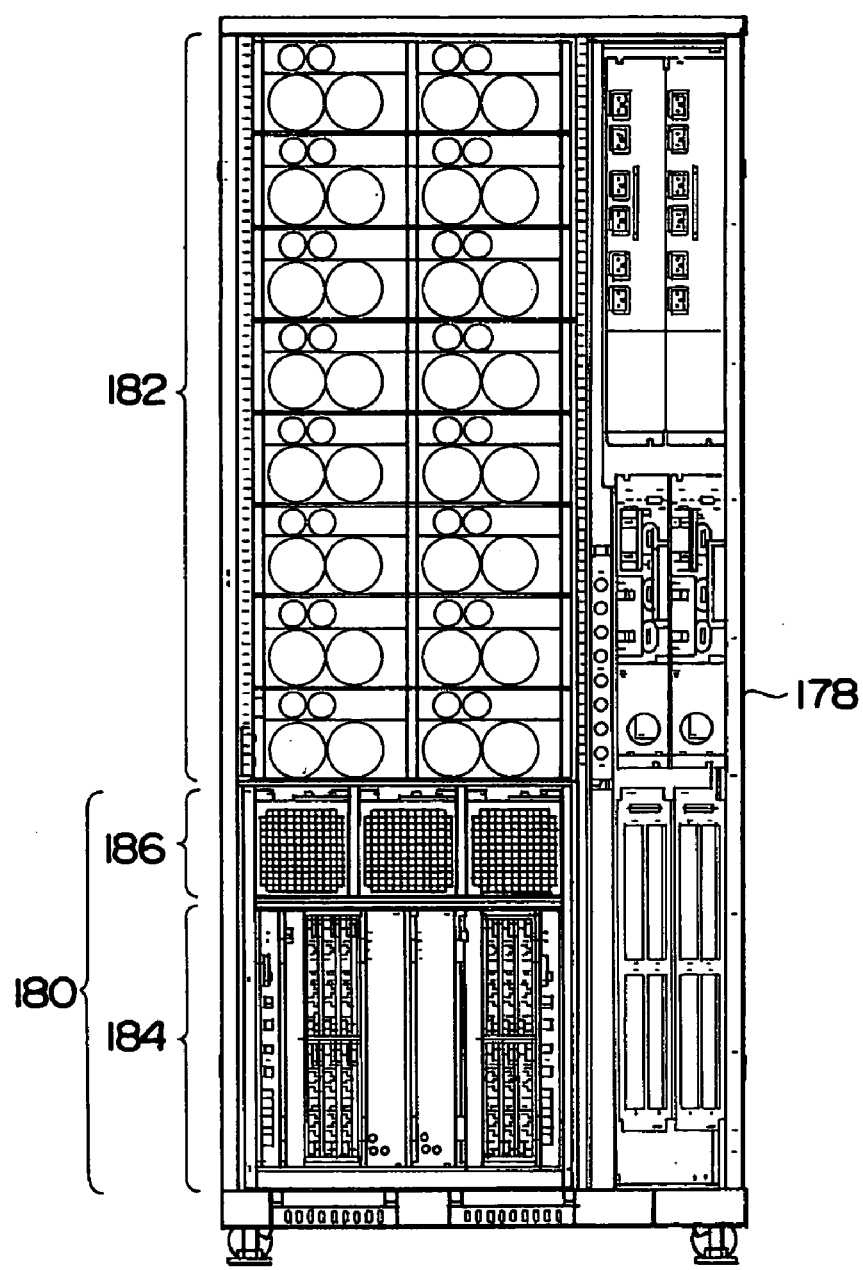
FIG. 20 is a rear view showing the information processing equipment according to the second embodiment of the invention.

Next, FIGS. 19 and 20 show an information processing equipment according to a second embodiment of the invention, wherein FIG. 19 is a front view of the information processing equipment and FIG. 20 is a rear view thereof. The information processing equipment is structured as a large server unit or a disk array unit, wherein a main enclosure 180 is installed on a lower stage of a main frame 178 and another enclosure 182 is installed on an upper stage of the main frame 178. The housing 100 as shown in FIGS. 6 to 8 is installed in the main enclosure 180, and a main unit 184 having the cooling structure as set forth above and a subunit 186 on the upper stage thereof are respectively detachably installed in the housing 100. The main unit 184 corresponds to the substrate units 108 as set forth above, and structures a power supply and information processing part. A DC—DC converter and so forth are mounted on the subunit 186. A hard disk unit and so forth are mounted on the other enclosure 182.

With the information processing equipment having such an arrangement, since the cooling structure of the electronic equipment of the invention is mounted on the main closure 180 side, the mounting efficiency and cooling capacity of the substrate units 108 are improved, thereby allowing the processing unit to be compact and improve a reliability thereof.

As mentioned in detail above, although the most preferred embodiments of the invention has been described, the invention is not limited to the embodiments, but it is a matter of fact that the invention can be modified variously and varied by a person skilled in the art on the basis of the gist of the invention as disclosed in the claims and detail description of the invention, and such a modification and change are included in the scope of the invention.

The entire disclosure of Japanese Patent Application No. 2003-43105 including specification, claims, drawings and summary are incorporated herein by reference in its entirety.

What is claimed is:

1. A cooling structure of an electronic equipment needing forced-air-cooling comprising:
   at least one substrate housing part detachably housing therein one or plurality of substrate units;
   an upstream side duct provided at the upstream side of air for cooling which is allowed to flow to said substrate housing part;
   a downstream side duct for allowing the air for cooling which passed from said upstream side duct through said substrate housing part to flow;
   exhaust means provided at an exhaust part for allowing said downstream side duct to open to an outside air to forcibly discharge air in said substrate housing part to the outside air, thereby allowing the air for cooling to flow to said substrate housing part; and
   air adjusting means for adjusting the air for cooling which passes from said upstream side duct to said downstream side duct through said substrate housing part, said air adjusting means having a plurality of adjustable air openings in opening areas corresponding to each of said substrate units in said substrate housing part,
   wherein said air adjusting means is installed in either or both of a first boundary part where said substrate housing part and said downstream side duct contact each other or a second boundary part where said substrate housing part and said upstream side duct contact each other, thereby adjusting the air for cooling to a volume of air corresponding to said substrate units installed in said substrate housing part.

2. A cooling structure of an electronic equipment according to claim 1, wherein said air adjusting means adjusts a volume of entire air for cooling which flows to said substrate housing part.

3. A cooling structure of an electronic equipment according to claim 1, wherein said air adjusting means changes exhaust capacity of the exhaust means.

4. A cooling structure of an electronic equipment according to claim 1, further comprising first and second substrate housing frame bodies which are detachably provided in a housing, and said substrate housing part is installed in each of said substrate housing frame bodies.

5. A cooling structure of an electronic equipment according to claim 1, wherein said air openings are adjusted by reducing or enlarging a size of said air openings, or decreasing or increasing the number of said air openings in said opening areas.

6. A cooling structure of an electronic equipment according to claim 1, further comprising a motor for driving said exhaust means, and control means for controlling a driving input relative to said motor to control the number of revolution.

7. A cooling structure of an electronic equipment needing forced-air-cooling comprising:
   at least one substrate housing part detachably housing therein one or plurality of substrate units;
   an upstream side duct for allowing air for cooling to flow to said substrate housing part;
   a downstream side duct for allowing the air for cooling which passed through said substrate housing part in a first direction to flow;
   first exhaust means provided at a first exhaust part for allowing said downstream side duct to open to an outside air to forcibly discharge air in said substrate housing part to the outside air, thereby allowing the air for cooling to flow to said substrate housing part;
   a housing unit detachably installed in said downstream side duct;
   second exhaust means for allowing the air for cooling to flow from said downstream side duct into said housing unit by exhausting air from a second exhaust part for allowing said housing unit to open to the outside air; and
   air adjusting means installed in either or both of boundary parts where said substrate housing part contacts said downstream side duct or said upstream side duct, said air adjusting means having a plurality of adjustable air openings in opening areas corresponding to each of said substrate units in said substrate housing part,
   wherein a volume of the air for cooling is adjusted by dividing between air leading to said first exhaust means through said downstream side duct and air leading to said second exhaust means through said housing unit, by said housing unit installed in said downstream side duct,
   thereby adjusting the air for cooling to a volume of air corresponding to said substrate units installed in said substrate housing part.

8. A cooling structure of an electronic equipment according to claim 7, wherein said second exhaust part of said housing unit side and said downstream side duct are partitioned to have an exhaust guide for intercepting exhaust air at said housing unit side from said downstream side duct.

9. A cooling structure of an electronic equipment needing forced-air-cooling comprising:
   at least one substrate housing part installed in a housing to detachably house therein substrate units;
   an upstream side duct provided at the upstream side of air for cooling which is allowed to flow to said substrate housing part;
   a downstream side duct for allowing the air for cooling, which passed through said substrate housing part from said upstream side duct, to flow;
   an intake part for guiding the air for cooling to said upstream side duct;
   an exhaust part for exhausting the air for cooling from said downstream side duct;
   exhaust means installed in said exhaust part for forcibly discharging air in said housing to an outside air to allow the air for cooling to flow to said substrate housing part; and
   air adjusting means for adjusting the air for cooling which flows from said upstream side duct to said downstream side duct through said substrate housing part, said air adjusting means having a plurality of adjustable air openings in opening areas corresponding to each of said substrate units in said substrate housing part,
   wherein said air adjusting means is installed in either or both of a first boundary part where said substrate housing part and said downstream side duct contact each other or a second boundary part where said substrate housing part and said upstream side duct contact each other, thereby adjusting the air for cooling to a volume of air corresponding to said substrate units installed in said substrate housing part.

10. A cooling structure of an electronic equipment according to claim 9, further comprising a housing unit provided in said downstream side duct with an intake part which is allowed to open to said downstream side duct, and intake fans installed at said intake part.

11. A cooling structure of an electronic equipment needing forced-air-cooling comprising:
at least one substrate housing part for detachably housing therein substrate units from a wall face side of a housing;
an upstream side duct provided at the upstream side of air for cooling which is allowed to flow to said substrate housing part;
a downstream side duct for allowing the air for cooling, which passed through said substrate housing part from said upstream side duct, to flow;
a ventilation part provided at the wall face of said housing for allowing said upstream side duct to open to an outside air;
a first exhaust part provided at the wall face of said housing for allowing said downstream side duct to open to the outside air;
first exhaust means provided at said first exhaust part to forcibly discharge air in said housing to the outside air to allow the air for cooling to flow to said substrate housing part;
air adjusting means for adjusting the air for cooling which flows from said upstream side duct to said downstream side duct through said substrate housing part, said air adjusting means having a plurality of adjustable air openings in opening areas corresponding to each of said substrate units in said substrate housing part; and
a housing unit installed on said downstream side duct for housing a circuit unit; and
second exhaust means provided in said housing unit or housing for exhausting air from said second exhaust part of said housing by allowing the air for cooling to flow to said housing unit,
wherein said air adjusting means is installed in either or both of a first boundary part where said substrate housing part and said downstream side duct contact each other or a second boundary part where said substrate housing part and said upstream side duct contact each other, the air for cooling is adjusted to a volume of air corresponding to said substrate units installed in said substrate housing part by said air adjusting means, and a volume of the air for cooling which flows to said downstream side duct is adjusted by said housing unit.

12. An information processing equipment comprising:
at least one substrate housing part detachably housing therein one or plurality of substrate units;
an upstream side duct provided at the upstream side of air for cooling which is allowed to flow to said substrate housing part;
a downstream side duct for allowing the air for cooling which passed from said upstream side duct through said substrate housing part to flow;
exhaust means provided at an exhaust part for allowing said downstream side duct to open to an outside air to forcibly discharge air in said substrate housing part to the outside air, thereby allowing the air for cooling to flow to said substrate housing part; and
air adjusting means for adjusting the air for cooling which passes from said upstream side duct to said downstream side duct through said substrate housing part, said air adjusting means having a plurality of adjustable air openings in opening areas corresponding to each of said substrate units in said substrate housing part,
wherein said air adjusting means is installed in either or both of a first boundary part where said substrate housing part and said downstream side duct contact each other or a second boundary part where said substrate housing part and said upstream side duct contact each other, thereby adjusting the air for cooling to a volume of air corresponding to said substrate units installed in said substrate housing part.

13. An information processing equipment according to claim 12, wherein said air adjusting means adjusts a volume of entire air for cooling which flows to said substrate housing part.

14. An information processing equipment according to claim 12, wherein said air adjusting means changes exhaust capacity of the exhaust means.

15. An information processing equipment according to claim 12, further comprising first and second substrate housing frame bodies which are detachably provided in a housing, and said substrate housing part is installed in each of said substrate housing frame bodies.

16. An information processing equipment according to claim 12, said air openings are adjusted by reducing or enlarging a size of the air openings, or decreasing or increasing the number of said air openings in said opening areas.

17. An information processing equipment according to claim 12, further comprising a motor for driving said exhaust means, and control means for controlling a driving input relative to said motor to control the number of revolution.

18. An information processing equipment comprising:
at least one substrate housing part detachably housing therein one or plurality of substrate units;
an upstream side duct for allowing air for cooling to flow to said substrate housing part;
a downstream side duct for allowing the air for cooling which passed through said substrate housing part to flow;
first exhaust means provided at a first exhaust part for allowing said downstream side duct to open to an outside air to forcibly discharge air in said substrate housing part to the outside air, thereby allowing the air for cooling to flow to said substrate housing part;
a housing unit detachably installed in said downstream side duct;
second exhaust means for allowing the air for cooling to flow from said downstream side duct into said housing unit by exhausting air from a second exhaust part for allowing said housing unit to open to the outside air; and
air adjusting means installed in either or both of boundary parts where said substrate housing part contacts said downstream side duct or said upstream side duct, said air adjusting means having a plurality of adjustable air openings in opening areas corresponding to each of said substrate units in said substrate housing part,
wherein a volume of the air for cooling is adjusted by dividing between air leading to said first exhaust means through said downstream side duct and air leading to said second exhaust means through said housing unit, by said housing unit installed in said downstream side duct, thereby adjusting the air for cooling to a volume of air corresponding to said substrate units installed in said substrate housing part.

19. An information processing equipment according to claim 18, wherein said second exhaust part of said housing unit side and said downstream side duct are partitioned to have an exhaust guide for intercepting exhaust air at said housing unit side from said downstream side duct.

20. An information processing equipment comprising:
at least one substrate housing part installed in a housing to detachably house therein substrate units;
an upstream side duct provided at the upstream side of air for cooling which is allowed to flow to said substrate housing part;
a downstream side duct for allowing the air for cooling, which passed through said substrate housing part from said upstream side duct, to flow;
an intake part for guiding the air for cooling to said upstream side duct;
an exhaust part for exhausting the air for cooling from said downstream side duct;
exhaust means installed in said exhaust part for forcibly discharging air in said housing to an outside air to allow the air for cooling to flow to said substrate housing part; and
air adjusting means for adjusting the air for cooling which flows from said upstream side duct to said downstream side duct through said substrate housing part, said air adjusting means having a plurality of adjustable air openings in opening areas corresponding to each of said substrate units in said substrate housing part,
wherein said air adjusting means is installed in either or both of a first boundary part where said substrate housing part and said downstream side duct contact each other or a second boundary part where said substrate housing part and said upstream side duct contact each other, thereby adjusting the air for cooling to a volume of air corresponding to said substrate units installed in said substrate housing part.

21. An information processing equipment according to claim 20, further comprising a housing unit provided in said downstream side duct with an intake part which is allowed to open to said downstream side duct, and intake fans installed at said intake part.

22. An information processing equipment comprising:
at least one substrate housing part for detachably housing therein substrate units from a wall face side of a housing;
an upstream side duct provided at the upstream side of air for cooling which is allowed to flow to said substrate housing part;
a downstream side duct for allowing the air for cooling, which passed through said substrate housing part from said upstream side duct, to flow;
a ventilation part provided at the wall face of said housing for allowing said upstream side duct to open to an outside air;
a first exhaust part provided at the wall face of said housing for allowing said downstream side duct to open to the outside air;
first exhaust means provided at said first exhaust part to forcibly discharge air in said housing to the outside air to allow the air for cooling to flow to said substrate housing part;
air adjusting means for adjusting the air for cooling which flows from said upstream side duct to said downstream side duct through said substrate housing part, said air adjusting means having a plurality of adjustable air openings in opening areas corresponding to said substrate units in said substrate housing part;
a housing unit installed on said downstream side duct for housing a circuit unit; and
second exhaust means provided in said housing unit or housing for exhausting air from a second exhaust part of said housing by allowing the air for cooling to flow to said housing unit,
wherein said air adjusting means is installed in either or both of a first boundary part where said substrate housing part and said downstream side duct contact each other or a second boundary part where said substrate housing part and said upstream side duct contact each other, the air for cooling is adjusted to a volume of air corresponding to said substrate units installed in said substrate housing part by said air adjusting means, and a volume of the air for cooling which flows to said downstream side duct is adjusted by said housing unit.

* * * * *